United States Patent
Fujii et al.

(10) Patent No.: US 9,773,932 B2
(45) Date of Patent: Sep. 26, 2017

(54) EPITAXIAL WAFER AND METHOD FOR MANUFACTURING SAME

(71) Applicant: Sumitomo Electric Industries, Ltd., Osaka-shi (JP)

(72) Inventors: Kei Fujii, Itami (JP); Koji Nishizuka, Itami (JP); Takashi Kyono, Itami (JP); Kaoru Shibata, Itami (JP); Katsushi Akita, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/028,225

(22) PCT Filed: Aug. 18, 2014

(86) PCT No.: PCT/JP2014/071560
§ 371 (c)(1),
(2) Date: Apr. 8, 2016

(87) PCT Pub. No.: WO2015/059988
PCT Pub. Date: Apr. 30, 2015

(65) Prior Publication Data
US 2016/0247951 A1 Aug. 25, 2016

(30) Foreign Application Priority Data
Oct. 22, 2013 (JP) .................................. 2013-219597

(51) Int. Cl.
*H01L 21/00* (2006.01)
*H01L 31/00* (2006.01)
(Continued)

(52) U.S. Cl.
CPC .. *H01L 31/035236* (2013.01); *H01L 21/0262* (2013.01); *H01L 21/02392* (2013.01);
(Continued)

(58) Field of Classification Search
CPC ........ H01L 21/02392; H01L 21/02461; H01L 21/02463; H01L 21/02466; H01L 21/02507; H01L 21/0262; H01L 21/02546; H01L 31/1832; H01L 31/03042; H01L 31/03046; H01L 31/035236; Y02E 10/544; Y02P 70/521
See application file for complete search history.

(56) References Cited

U.S. PATENT DOCUMENTS 5,999,298 A * 12/1999 Ishizaka ................. B82Y 20/00
359/248
2014/0008614 A1* 1/2014 Fujii .................. H01L 21/02392
257/21

FOREIGN PATENT DOCUMENTS

JP 2-181978 A 7/1990
JP 2003-064090 A 3/2003
(Continued)

OTHER PUBLICATIONS

Forrest, "Performance of $In_xGa_{1-x}As_yP_{1-y}$ Photodiodes with Dark Current Limited by Diffusion, Generation Recombination, and Tunneling," IEEE Journal of Quantum Electronics, vol. QE-17, No. 2, pp. 217-226, Feb. 1981.
(Continued)

*Primary Examiner* — Nikolay Yushin
(74) *Attorney, Agent, or Firm* — Venable LLP; Michael A. Sartori; Miguel A. Lopez

(57) ABSTRACT

An epitaxial wafer which allows manufacture of a photodiode having suppressed dark current and ensured sensitivity, and a method for manufacturing the epitaxial wafer, are provided. The epitaxial wafer of the present invention includes: a III-V semiconductor substrate; and a multiple quantum well structure disposed on the substrate, and including a plurality of pairs of a first layer and a second layer. The total concentration of elements contained as impurities in the multiple quantum well structure is less than or equal to $5 \times 10^{15}$ $cm^{-3}$.

11 Claims, 5 Drawing Sheets

(51) Int. Cl.
  *H01L 31/0352* (2006.01)
  *H01L 21/02* (2006.01)
  *H01L 31/0304* (2006.01)
  *H01L 31/18* (2006.01)

(52) U.S. Cl.
  CPC .. *H01L 21/02461* (2013.01); *H01L 21/02463* (2013.01); *H01L 21/02466* (2013.01); *H01L 21/02507* (2013.01); *H01L 21/02546* (2013.01); *H01L 31/03042* (2013.01); *H01L 31/03046* (2013.01); *H01L 31/1832* (2013.01); *Y02E 10/544* (2013.01); *Y02P 70/521* (2015.11)

(56) References Cited

FOREIGN PATENT DOCUMENTS

| | | | | |
|---|---|---|---|---|
| JP | 2006-104189 A | 4/2006 | | |
| JP | 2007-137883 A | 6/2007 | | |
| JP | 2011-086615 | * | 4/2011 | ......... H01L 31/0304 |
| JP | 2011-193024 A | 9/2011 | | |
| WO | WO-2011/016309 A1 | 2/2011 | | |

OTHER PUBLICATIONS

International Search Report in PCT International Application No. PCT/JP2014/071560, dated Oct. 7, 2014.

* cited by examiner

EPITAXIAL WAFER AND METHOD FOR MANUFACTURING SAME

TECHNICAL FIELD

The present invention relates to an epitaxial wafer and a method for manufacturing the epitaxial wafer. More specifically, the invention relates to an epitaxial wafer including an absorption layer having a bandgap energy corresponding to light in a near-infrared to infrared region, and a method for manufacturing the epitaxial wafer.

BACKGROUND ART

Since absorption spectra of substances relating to living bodies, health, environments and the like are located in a near-infrared to infrared wavelength region, photodiodes having sensitivity in this wavelength region have been developed. For example, NON PATENT LITERATURE 1 proposes a photodiode including an absorption layer having an InGaAs/GaAsSb type-II multiple quantum well (MQW) structure on an InP substrate, as a device to improve sensitivity on the long wavelength side of the near-infrared region. This photodiode is a mesa-type single-pixel photodiode, and includes an InGaAs buffer disposed on the InP substrate, and the InGaAs/GaAsSb type-II multiple quantum well structure disposed on the buffer. This photodiode has a cutoff wavelength of 2.39 μm, and sensitivity characteristics at wavelengths from 1.7 μm to 2.7 μm are shown.

Meanwhile, a photodiode including an array of a plurality of pixels (absorption portions) is used in image pickup devices and the like. PATENT LITERATURE 1 proposes a planar photodiode in which an array of pixels is formed by introducing impurities by selective diffusion. In the photodiode, the above-mentioned InGaAs/GaAsSb type II multiple quantum well structure is used, and a semiconductor layered structure is appropriately modified to prevent the multiple quantum well structure from being deteriorated by the impurities. By using this semiconductor layered structure, it is possible to obtain a photodiode including arrayed pixels having sensitivity in the near-infrared to infrared region.

Although the above-mentioned image pickup devices and the like are desired to provide high-definition images, it has been known that the above-mentioned near-infrared-to-infrared photodiode has degradation of image quality caused by dark current. For example, in NON PATENT LITERATURE 1, since there are multiple causes of dark current, study to theoretically know the degree of each cause has been executed.

CITATION LIST

Patent Literature

[PATENT LITERATURE 1] Japanese Laid-Open Patent Publication No. 2011-193024

Non Patent Literature

[NON PATENT LITERATURE 1] Stephen R. Forrest, "Performance of $In_xGa_{1-x}As_yP_{1-y}$ Photodiodes with Dark Current Limited by Diffusion, Generation Recombination, and Tunneling", IEEE Journal of Quantum Electronics, Vol. QE-17, No. 2, February 1981

SUMMARY OF THE INVENTION

Problems to be Solved by the Invention

According to NON PATENT LITERATURE 1, many types of currents making up dark current are described. It is generally known that, among the currents, a diffusion current and a generation-recombination current are dominant. The literature describes that both the two dark current components are correlated to the carrier concentration of the absorption layer, and the higher the carrier concentration is, the more the dark current increases. Therefore, in order to obtain a high-quality image by suppressing the dark current, the carrier concentration of the absorption layer needs to be reduced. For a 1.5 μm band InGaAs photodiode for optical communication, a method for growing high-quality crystals as well as source materials thereof have been established, and therefore, it is easy to obtain an absorption layer having a low carrier concentration. However, for growth of a semiconductor layer containing antimony to extend the detection wavelength to the longer-wavelength region, a method for growing high-quality crystals as well as source materials thereof have not been established, and therefore, it is difficult to obtain an absorption layer having a low carrier concentration.

In addition, when the carrier concentration is increased, expansion of a depletion layer is reduced when a reverse bias voltage is applied to the photodiode, resulting in reduction in sensitivity. Therefore, in order to obtain a high-sensitivity photodiode, the carrier concentration of the absorption layer needs to be reduced.

The present invention has an object to provide an epitaxial wafer which allows manufacture of a photodiode in which dark current is suppressed and good sensitivity is ensured, and a method for manufacturing the epitaxial wafer.

Solution to the Problems

A photodiode according to the present invention includes: a III-V semiconductor substrate; and a multiple quantum well (MQW) structure disposed on the substrate, and including a plurality of pairs of a first layer and a second layer. The total concentration of elements contained as impurities in the multiple quantum well structure is less than or equal to $5 \times 10^{15}$ cm$^{-3}$ (5E15 cm$^{-3}$). The elements contained as impurities in the multiple quantum well structure will be described later.

Advantageous Effects of the Invention

According to the above-mentioned embodiment, it is possible to provide an epitaxial wafer which allows manufacture of a photodiode having suppressed dark current.

DESCRIPTION OF EMBODIMENTS

Description of Embodiments of Present Invention

Figure 1:
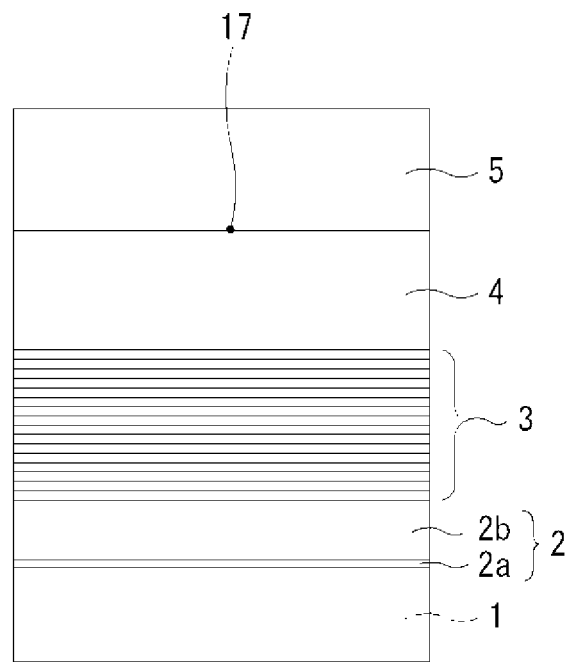
FIG. 1 is a diagram showing an epitaxial wafer according to an embodiment of the present invention.

First, contents of an embodiment of the present invention will be enumerated and are described.

1. Epitaxial Wafer:

(1) Impurity Concentration in Multiple Quantum Well Structure:

An epitaxial wafer according to the present invention includes a III-V semiconductor substrate, and a multiple quantum well structure that is disposed on the substrate and includes a plurality of pairs of a first layer and a second layer. In the multiple quantum well structure, the total concentration of elements contained as impurities is less than or equal to $5\times10^{15}$ cm$^{-3}$ (5E15 cm$^{-3}$).

The "elements contained as impurities in the multiple quantum well structure" are not impurities due to doping, selective diffusion, and the like during deposition but are impurities unintentionally incorporated into the multiple quantum well structure. Specifically, such impurities can be specified as follows.

(α) Such impurities are uniformly distributed over the entirety of a deposited layer when seen in a plan view, in contrast to the impurity selectively diffused. In this regard, the impurities are distributed in a similar manner to being doped, when seen in a plan view. In the present invention, however, since the multiple quantum well structure is not doped (is non-doped), the impurities uniformly distributed over the entirety of the deposited layer when seen in a plan view are the "elements contained as impurities in the multiple quantum well structure".

Although the impurities can be perfectly specified by the above (α), the following points will be added.

(β) When the "elements contained as impurities in the multiple quantum well structure" are specified in the state of a photodiode, if selective diffusion has been done, impurities in regions not subjected to the selective diffusion (regions having no influence of the selective diffusion) are the "elements contained as impurities in the multiple quantum well structure".

(γ) In a case where a p-n junction (actually, a p-i junction or a p-i-n junction) is not formed by selective diffusion but formed by doping, a layer on the multiple quantum well structure is doped with a p-type impurity, a layer under the multiple quantum well structure is doped with an n-type impurity, and the multiple quantum well structure is non-doped. Therefore, a p-i-n junction is formed as literally expressed (however, all the above-mentioned junctions are comprehensively expressed as "p-n junction"). Accordingly, if impurities are present in the multiple quantum well structure even in the state of a photodiode, the impurities are the "elements contained as impurities in the multiple quantum well structure".

The above-mentioned total concentration of impurities in the multiple quantum well structure, which is less than or equal to $5\times10^{15}$ cm$^{-3}$ (5E15 cm$^{-3}$), is an averaged value in the thickness direction of the multiple quantum well structure as well as in the plan view.

(Function): When the total concentration of impurities in the multiple quantum well structure exceeds $5\times10^{15}$ cm$^{-3}$ (5E15 cm$^{-3}$), the following problems (D1) and (D2) occur.

(D1) These impurities directly increase dark current.

(D2) These impurities induce disturbance in the crystal structure to increase dark current.

The above-mentioned problems can be overcome by setting the total concentration of elements contained as impurities in the multiple quantum well structure to be less or equal to $5\times10^{15}$ cm$^{-3}$ (5E15 cm$^{-3}$).

(2) Types of Impurity Elements

The total concentration of sulfur (S), selenium (Se), and tellurium (Te) contained as impurities in the multiple quantum well structure may be less than or equal to $5\times10^{15}$ cm$^{-3}$ (5E15 cm$^{-3}$).

The following (D3) is a problem caused by the above-mentioned specific impurity elements.

(D3) The above-mentioned impurities are n-type carriers, and when the impurities are included in an n-type region of a p-n junction, the impurities suppress expansion of a depletion layer with respect to a reverse bias voltage being applied. Suppressing expansion of the depletion layer means contraction of a light absorbable region, and immediately causes reduction in sensitivity.

By setting the total concentration of sulfur (S), selenium (Se), and tellurium (Te) to be less than or equal to $5\times10^{15}$ cm$^{-3}$ (5E15 cm$^{-3}$), it is possible to provide an epitaxial wafer which allows manufacture of a photodiode capable of suppressing dark current and ensuring good sensitivity.

Further, the total concentration of sulfur (S), selenium (Se), and tellurium (Te) contained as impurities may be less than or equal to $2.5\times10^{15}$ cm$^{-3}$ (2.5E15 cm$^{-3}$), whereby the above-mentioned suppression of dark current and ensuring of good sensitivity can be achieved more easily.

(3) Relationship with Constituent Elements in Multiple Quantum Well Structure

It is premised that, in the above-mentioned epitaxial wafer, the multiple quantum well structure contains antimony (Sb) as a constituent atom thereof, and is manufactured by metal-organic vapor phase epitaxy (MOVPE). As sources for metal-organic vapor phase epitaxy, metal-organic sources containing the constituent elements are used. As a source of antimony (Sb), trimethylantimony (TMSb), triethylantimony (TESb), triisopropylantimony (TIPSb), trisdimethylaminoantimony (TDMASb), tritertiarybutylantimony (TTBSb), or the like is used. The inventors of the present invention have focused on the fact that sulfur (S), selenium (Se), tellurium (Te), silicon (Si), germanium (Ge), and tin (Sn) are included at higher concentrations in the metal-organic sources of antimony than in other source gases of As and the like. As a result, the inventors have found the above-mentioned problems and completed the present invention.

As described above, there are cases where the source gas of antimony further contains, as impurities, silicon (Si), germanium (Ge), and tin (Sn) at high concentrations. Like tellurium (Te) and the like, these impurities also act to increase dark current and reduce sensitivity. The total concentration of elements including silicon (Si), germanium (Ge) and tin (Sn) in addition to sulfur (S), selenium (Se), and tellurium (Te) can be set to be less than or equal to $5\times10^{15}$ cm$^{-3}$ (5E15 cm$^{-3}$), whereby the above-mentioned effects can be reliably achieved.

(4) Impurity Concentrations in Respective Layers of Multiple Quantum Well Structure Preferably, antimony (Sb) is contained, as a constituent element of the multiple quantum well structure, in only the first layer, and the total concentration of sulfur (S), selenium (Se), tellurium (Te), silicon (Si), germanium (Ge), and tin (Sn) contained as impurities is less than or equal to $1\times10^{16}$ cm$^{-3}$ (1E16 cm$^{-3}$) in the first layer.

The above-mentioned impurities are contained at a higher concentration in the source gas of antimony (Sb) than in other source gases. The first layer contains antimony (Sb) as a constituent element whereas the second layer does not contain Sb as a constituent element. Therefore, the upper limit of the impurity concentration in the first layer is higher than a value obtained by averaging the impurity concentration over the multiple quantum well structure. In the second layer which is another layer paired with the first layer, the total concentration of sulfur (S), selenium (Se), tellurium (Te), silicon (Si), germanium (Ge), and tin (Sn) contained as impurities is preferably less than or equal to $1\times10^{15}$ cm$^{-3}$ (1E15 cm$^{-3}$).

Since the source gas of antimony is not injected to the second layer, it is preferable to suppress the impurity concentration to be low as described above.

2. III-V Semiconductors of Substrate and Multiple Quantum Well Structure

Preferably, the substrate is an InP substrate. Preferably, in the multiple quantum well structure, the first layer is composed of a III-V semiconductor including at least Ga, As, and Sb, and the second layer is composed of a III-V semiconductor including at least In, Ga, and As.

Using the above-mentioned III-V semiconductors allows formation of a type II multiple quantum well structure having a cutoff wavelength in the near-infrared to infrared region by use of an InP substrate which is available in a relatively large size on an industrial scale.

3. Layered Structure of Epitaxial Wafer:

(1) Case where it is Premised to Perform Selective Diffusion (Case of Planar Photodiode)

Preferably, the epitaxial wafer includes: a diffusive-concentration-distribution-adjusting layer which is disposed on the multiple quantum well structure and is composed of a III-V semiconductor; and a window layer which is disposed on the diffusive-concentration-distribution-adjusting layer and is composed of a III-V semiconductor.

When arrayed photodiodes are formed by selective diffusion, if an impurity (e.g., zinc (Zn)) for forming p-n junctions, which is selectively diffused from the surface of the window layer, excessively enters the multiple-quantum-well absorption layer, the impurity degrades crystallinity of the multiple quantum well structure and increases dark current. When the diffusive-concentration-distribution-adjusting layer is disposed between the window layer and the multiple quantum well structure, a depth range in which the concentration of the impurity such as Zn steeply changes from a high concentration region at the surface of the window layer to a low concentration region at a front end of diffusion, can be easily and stably located in the diffusive-concentration-distribution-adjusting layer. As a result, when a photodiode array (pixel array) is industrially formed by selective diffusion of Zn or the like, excessive entry of Zn or the like into the multiple quantum well structure can be stably avoided, whereby the manufacturing yield can be improved.

(2) Deposition Method in Case where InP Window Layer is Included:

In the case where the window layer is a layer containing phosphorus (P) such as an InP layer, industrial manufacture by molecular beam epitaxy (MBE) using solid sources requires a lot of man-hours and costs. The reason is as follows. Since MBE uses a solid source as a source of phosphorous, the solid phosphorous source attaches to an inner wall of an MBE deposition chamber when an InP layer is grown, for example. The solid phosphorous source has high ignitability, which leads to a high possibility of fire accident when the chamber is opened for source introduction or maintenance during MBE. Therefore, measures for preventing such accident are required. Thus, when the window layer is a layer containing phosphorus (P) such as an InP layer, a growth method has been often used in which layers beneath the InP window layer are grown by MBE, and the InP window layer is grown by MOVPE or the like using a metal-organic source as a source of InP. This growth method is sometimes called a hybrid growth method. In the hybrid growth method, after the layers beneath the InP window layer are grown by MBE, the wafer (intermediate product) is taken out (to the atmosphere) from the MBE growth chamber, and then the wafer (intermediate product) is charged into an MOVPE growth chamber. At this time, the wafer (intermediate product) is brought into contact with the atmosphere (clean room environment). As a result, a concentrated layer of elements contained in the atmosphere, such as oxygen, is formed between the InP window layer and a layer immediately beneath the InP window layer. That is, "the window layer is composed of InP, and a pile-up layer (regrown interface) in which at least one of {oxygen (O), carbon (C), and hydrogen (H)} is concentrated is formed at a boundary portion between the InP window layer and the layer beneath the InP window layer". When the regrown interface in which at least one of {oxygen (O), carbon (C), and hydrogen (H)} is concentrated has been formed, the regrown interface and the p-type region form an intersection line, and leakage current occurs in the intersection line. Such leakage current significantly degrades device characteristics. In the case of the present invention, since the layers are consistently grown by MOVPE from the start of the growth to the end of formation of the InP window layer, the above-mentioned regrown interface is not formed. That is, the present invention is characterized by that "the window layer is composed of InP, and a regrown interface in which at least one of {oxygen (O), carbon (C), and hydrogen (H)} is concentrated is absent at a boundary portion between the diffusive-concentration-distribution-adjusting layer and the InP window layer".

In the case of using the InP window layer, InP has a good affinity with a specific material (silicon oxide film or silicon nitride film) serving as a passivation film to protect the entirety of the III-V semiconductor layered structure from moisture and the like. Therefore, leakage current (one factor of dark current) that occurs at the interface between the passivation film and the InP window layer can be eliminated. Therefore, it can be said that probability of adopting the InP window layer is very high in the near-infrared-to-infrared photodiode using the III-V semiconductors.

(3) Epitaxial Wafer for Mesa-Type Photodiode:

The epitaxial wafer may include: a first conductivity type III-V semiconductor layer disposed on a side, facing the substrate, of the multiple quantum well structure; and a second conductivity type III-V semiconductor layer disposed on the multiple quantum well structure.

The above-mentioned limitation on the impurity concentration range according to the present invention is applicable not only to the planar photodiode but also to a mesa-type photodiode. In the case of the planar photodiode, since selective diffusion to form a p-n junction is performed later, no impurity is intentionally doped into the (multiple quantum well structure/selective-diffusion-concentration-distribution adjusting layer/window layer) during deposition thereof. In contrast, in the epitaxial wafer for the mesa-type photodiode, an impurity is doped such that the layer beneath the multiple quantum well structure has the first conductivity type and the layer on the multiple quantum well structure has the second conductivity type, as described above. In this case, since the multiple quantum well structure is non-doped (i-type), a p-i-n photodiode is resulted. However, even in such a case, it is considered, in a broad sense, that a p-n junction is formed.

In the mesa-type photodiode, the arrayed photodiodes (pixels) are separated from each other by mesa grooves. Although the number of photodiodes (pixels) per unit area (pixel density) can be increased, how to suppress increase in dark current becomes an issue.

4. Photodiode

A photodiode manufactured by using the above-mentioned epitaxial wafer has suppressed dark current and ensures good sensitivity.

5. Method for Manufacturing Epitaxial Wafer:

(1) A method for manufacturing an epitaxial wafer according to the present invention is a method for manufacturing an epitaxial wafer including a III-V semiconductor substrate, and includes the steps of: growing a III-V semiconductor buffer layer on the substrate; and growing a multiple quantum well structure composed of III-V semiconductors on the buffer layer. In the step of growing the multiple quantum well structure, the multiple quantum well structure is grown by metal-organic vapor phase epitaxy (MOVPE) so that the total concentration of elements contained as impurities in the multiple quantum well structure is less than or equal to $5 \times 10^{15}$ cm$^{-3}$ (5E15 cm$^{-3}$). The multiple quantum well structure may be grown so that the total concentration of sulfur (S), selenium (Se), and tellurium (Te) contained as impurities in the multiple quantum well structure is less than or equal to $5 \times 10^{15}$ cm$^{-3}$ (5E15 cm$^{-3}$).

(2) Metal-organic vapor phase epitaxy is less likely to be restricted by the size of the substrate, and therefore is suitable for efficiently forming a semiconductor device having good crystallinity. The epitaxial wafer according to the present embodiment is grown by metal-organic vapor phase epitaxy. Metal-organic vapor phase epitaxy uses phosphine (PH$_3$) which is an inorganic source, as a source of phosphorus, and arsine (AsH$_3$) as a source of As (arsenic). Although ordinary metal-organic vapor phase epitaxy is used in the present invention, metal-organic vapor phase epitaxy using only metal-organic sources may be particularly used.

Metal-organic vapor phase epitaxy using only metal-organic sources is one type of metal-organic vapor phase epitaxy in which all source materials for film deposition are metal-organic gases. In the mode of metal-organic vapor phase epitaxy using only metal-organic sources, tertiarybutylphosphine (TBP) can be used as a source of phosphorus instead of phosphine (PH$_3$). In addition, as a source of arsenic, tertiarybutylarsine (TBAs) can be used instead of arsine (AsH$_3$).

By using metal-organic vapor phase epitaxy, growth can be performed consistently in the same growth chamber from the start of growth of the multiple quantum well structure to the end of growth of the InP window layer, without including a regrown interface (pile-up layer of oxygen or the like). Of course, metal-organic vapor phase epitaxy using only metal-organic sources may be used. According to metal-organic vapor phase epitaxy using only metal-organic sources, since tertiarybutylphosphine (TBP) is used as a source of phosphorus and decomposed at a lower temperature as compared to phosphine (PH$_3$) which is an inorganic source, low-temperature deposition is realized.

Since the multiple quantum well structure is grown by metal-organic vapor phase epitaxy (MOVPE) so that the total concentration of the elements contained as impurities in the multiple quantum well structure is less than or equal to $5 \times 10^{15}$ cm$^{-3}$ (5E15 cm$^{-3}$), it is possible to provide an epitaxial wafer which allows manufacture of a photodiode having suppressed dark current and ensured sensitivity. In addition, when the total concentration of sulfur (S), selenium (Se), and tellurium (Te) contained as impurities in the multiple quantum well structure is less than or equal to $5 \times 10^{15}$ cm$^{-3}$ (5E15 cm$^{-3}$), it is possible to provide an epitaxial wafer which allows manufacture of a photodiode capable of suppressing dark current, and ensuring good sensitivity.

(3) In the step of growing the multiple quantum well structure, it is preferable to use a metal-organic source in which the total concentration of sulfur (S), selenium (Se), tellurium (Te), silicon (Si), germanium (Ge), and tin (Sn) is less than or equal to 0.5 ppm, as a source of antimony used for metal-organic vapor phase epitaxy.

The above-mentioned impurity elements are likely to be taken into an organic source of antimony. If growth is performed using such a low-purity organic source, the impurities are taken into the semiconductor layers, leading to degraded purity of the semiconductor layers.

Therefore, by using the source of antimony in which the impurity concentration is controlled to be low as described above, it is possible to provide an epitaxial wafer which allows manufacture of a photodiode having suppressed dark current and ensured sensitivity.

Details of Embodiment of Present Invention

Next, specific examples of the epitaxial wafer and the like according to the embodiment of the present invention will be described with reference to the drawings. It is noted that the present invention is not limited to the examples, and the scope of the present invention is defined in the appended claims and includes equivalence of the description of the claims and all changes within the scope of the claims.

FIG. 1 is a diagram showing an epitaxial wafer 10 according to a specific example of the embodiment of the present invention, and the epitaxial wafer 10 is composed of a layered structure as follows:

(InP substrate 1/buffer layer 2 (first buffer layer 2a/second buffer layer 2b)/absorption layer 3 having type II (GaAsSb/InGaAs) multiple quantum well structure/InGaAs diffusive-concentration-distribution-adjusting layer 4/InP window layer 5).

Figure 2:
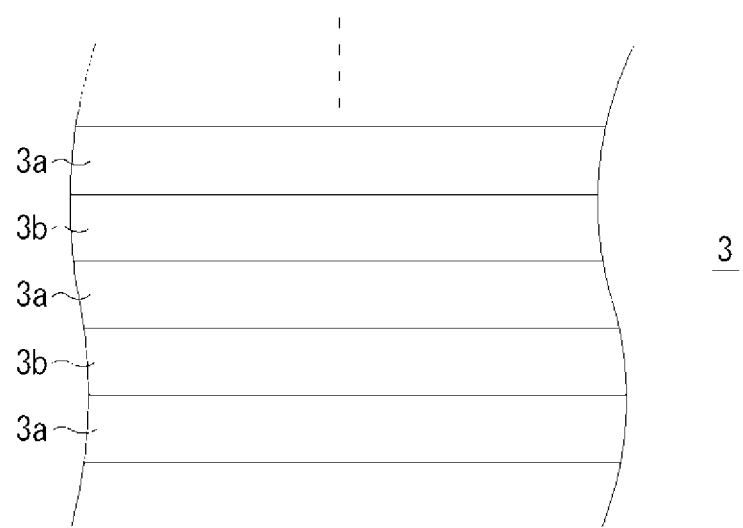
FIG. 2 is a partially enlarged view of a type II multiple quantum well structure which is an absorption layer.

FIG. 2 is a partially enlarged view of the type II multiple quantum well structure which is the absorption layer 3. In this embodiment, the absorption layer 3 is composed of the type II (GaAsSb/InGaAs) multiple quantum well structure.

As described later, a source of antimony (Sb) contains a relatively large amount of impurities having a strong effect of increasing dark current. A layer containing antimony (Sb) is a GaAsSb first layer 3a. The type II (GaAsSb/InGaAs) multiple quantum well structure constituting the absorption layer 3 is a heart part in which light absorption occurs, and n-type impurities such as Te being incorporated into this portion in spots (periodically) cause the following degradation of performance, as described above.

(D1) The impurities are n-type carriers, and increase in the carrier concentration of the absorption layer causes increase in diffusion current and generation-recombination current which are dark current components.

(D2) The impurities induce disturbance in the crystal structure to increase dark current.

(D3) As described above, the impurities are n-type carriers, and when the impurities are included in the n-type region of the p-n junction, the impurities suppress expansion of a depletion layer with respect to a reverse bias voltage being applied. Suppressing expansion of the depletion layer means contraction of a light absorbable region, and causes reduction in sensitivity.

In order to avoid degradation of performance, the total concentration of sulfur (S), selenium (Se), and tellurium (Te) contained as impurities (elements other than the constituent elements) in the multiple quantum well structure 3 is set to be less than or equal to $5\times10^{15}$ cm$^{-3}$ (5E15 cm$^{-3}$). The numerical value less than or equal to $5\times10^{15}$ cm$^{-3}$ (5E15 cm$^{-3}$) is an average value in the multiple quantum well structure 3. In order to avoid degradation of performance of the photodiode more reliably, the total concentration of sulfur (S), selenium (Se), and tellurium (Te) may be set to be less than or equal to $2.5\times10^{15}$ cm$^{-3}$ (2.5E15 cm$^{-3}$).

The source of antimony (Sb) may further include, as impurities, silicon (Si), germanium (Ge), and tin (Sn) at high concentrations. Considering such a situation, the total concentration of silicon (Si), germanium (Ge), and tin (Sn) in addition to the concentrations of the above-mentioned impurities (S, Se, and Te) is preferably set to be less than or equal to $5\times10^{15}$ cm$^{-3}$ (5E15 cm$^{-3}$). That is, the total concentration of sulfur (S), selenium (Se), tellurium (Te), silicon (Si), germanium (Ge), and tin (Sn) is preferably set to be less than or equal to $5\times10^{15}$ cm$^{-3}$ (5E15 cm$^{-3}$).

Trace analysis for the above-mentioned impurities may be performed by secondary ion mass spectroscopy (SIMS). Thus, ultra-trace analysis (ppb or ppt order) can be accurately performed.

Antimony (Sb) is contained as a constituent element only in GaAsSb as the first layer 3a. Preferably, the total concentration of sulfur (S), selenium (Se), tellurium (Te), silicon (Si), germanium (Ge), and tin (Sn) contained as impurities in the GaAsSb 3a is set to be less than or equal to $1\times10^{16}$ cm$^{-3}$ (1E16 cm$^{-3}$). On the other hand, in InGaAs as the second layer 3b which does not contain Sb as a constituent element, the total concentration of sulfur (S), selenium (Se), tellurium (Te), silicon (Si), germanium (Ge), and tin (Sn) is preferably set to be less than or equal to $1\times10^{15}$ cm$^{-3}$ (1E15 cm$^{-3}$).

Thus, the impurity concentration can be managed for each of the pairs of layers. Each layer in the type II multiple quantum well structure constituting the absorption layer 3 can be appropriately designed in order to adjust the detection wavelength. In this case, preferably, the analysis should be performed so that the ion irradiation energy in the SIMS is narrowed as much as possible (the ion irradiation energy is narrowed to a degree that allows recognition of periodicity of Te distribution) as seen in a plan view.

Figure 3:
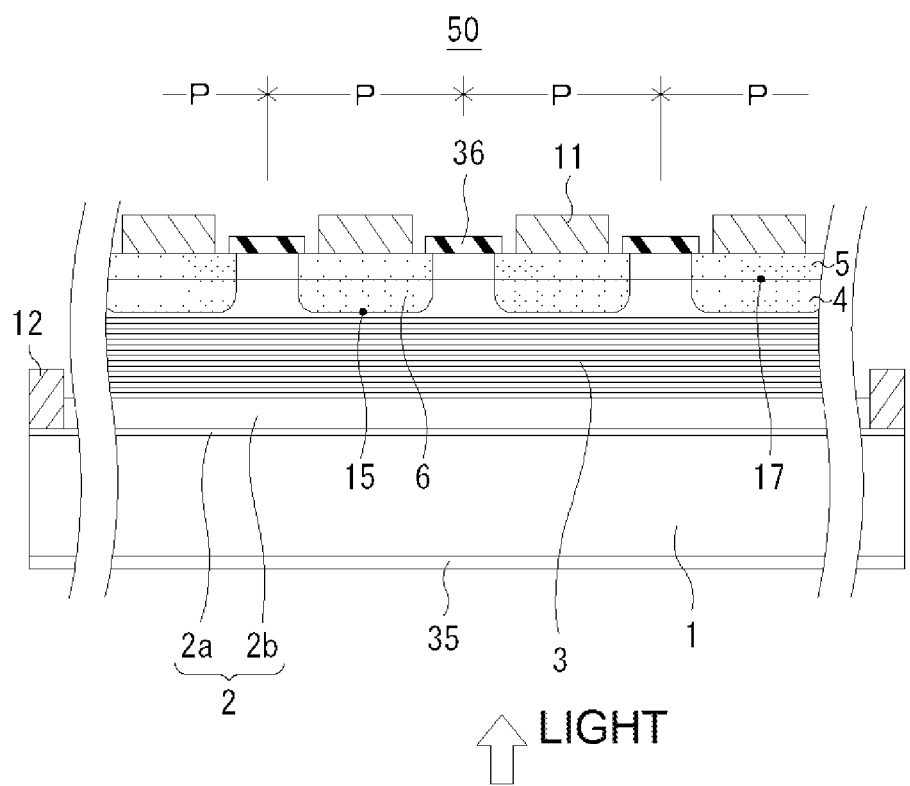
FIG. 3 is a diagram showing a planar photodiode 50 manufactured by using the epitaxial wafer shown in FIG. 1.

FIG. 3 is a diagram showing a planar photodiode 50 manufactured by using the epitaxial wafer shown in FIG. 1. The impurities in the type II multiple quantum well (GaAsSb/InGaAs) structure are limited as described above. Although the functions of the respective components shown in FIG. 3 will be described later in detail, doping for each component is as follows. The InP substrate 1 may be non-doped. However, preferably, the InP substrate 1 is doped with iron (Fe) so as to be semi-insulating, whereby transparency on the short wavelength side of the near-infrared region can be improved. When an n-electrode is brought into ohmic contact with the InP substrate 1, the InP substrate 1 may be doped with an n-type impurity such as sulfur (S). FIG. 3 shows the case of using such a Fe-doped semi-insulating InP substrate 1.

The buffer layer 2 is formed of a composite layer including an InP first buffer layer 2a and an InGaAs second buffer layer 2b. However, the buffer layer 2 may be a single layer, for example, a single InP layer or a single InGaAs layer. When the composite buffer layer is used, preferably, the InP first buffer layer 2a is doped with silicon (Si) at a high concentration, for example, $1\times10^{18}$ cm$^{-3}$ (1E18 cm$^{-3}$) so as to have a thickness of about 30 nm (0.03 μm). The InGaAs second buffer layer 2b is preferably doped with Si at a concentration lower than the above concentration, for example, $1\times10^{17}$ cm$^{-3}$ (1E17 cm$^{-3}$) so as to have a large thickness of about 300 nm (0.3 μm).

In the photodiode 50 shown in FIG. 3, a ground electrode 12 is in ohmic contact with the InP first buffer layer 2a. The thickness of the InP first buffer layer 2a is less than or equal to ⅕ of the thickness of the InGaAs second buffer layer 2b, and it is ¹⁄₁₀ in the present embodiment. In the case of using the semi-insulating InP substrate, preferably, the InP first buffer layer 2a may have a large thickness of 200 nm in order to reduce the resistance of the InP first buffer layer 2a. Regarding the buffer layer 2, the InP first buffer layer 2a is located on the side in contact with the InP substrate 1, and the second buffer layer 2b located on the InP first buffer layer 2a is formed of the same material as the InGaAs second layer 3b in the multiple quantum well structure. Thus, good crystallinity can be easily secured from the buffer layer 2 to the type II multiple quantum well structure 3. Further, by increasing the n-type dopant concentration of the InP first buffer layer 2a, the ground electrode 12 can be easily brought into ohmic contact with the InP first buffer layer 2a. The purpose of the low n-type impurity concentration and the large thickness of the InGaAs second buffer layer 2b is to improve the crystallinity of the type II multiple quantum well structure 3 by blocking lattice mismatch from the InP substrate 1 side.

A major part of each of pixels P is formed of a p-type region 6. The p-type regions are formed by selectively diffusing zinc (Zn) serving as a p-type impurity from the surface of the InP window layer 5 exposed in openings of a selective diffusion mask pattern 36. Each pixel P is separated from adjacent pixels P by regions that are not subjected to the selective diffusion, whereby isolation of each pixel P is ensured. At an end of the p-type region 6 of each pixel P, a p-n junction 15 or a p-i junction 15 is formed. It can be said that a p-i-n junction is formed when the structure is viewed in the broader range including the ground electrode side.

It is intended that no impurity is added to the absorption layer 3 to make the absorption layer 3 intrinsic (i-type). However, an n-type impurity is contained at a low concentration in the absorption layer 3 due to a reason derived from the source of antimony or other unknown reasons. In the present embodiment, as described above, the impurities such as Te which cause increase in dark current or the like are reduced to the above-mentioned level, whereby suppressed dark current and good sensitivity can be ensured.

When an impurity is selectively diffused into the InP window layer 5 of the epitaxial wafer 10 in accordance with the planar photodiode manufacturing procedure, there is a problem that the crystal structure of the multiple quantum well structure is vulnerable to the impurity. The crystallinity is degraded even by the impurity of a relatively low concentration, and dark current significantly increases. Therefore, when the p-n junctions 15 are formed, the diffusion range of the impurity introduced from the window layer 5 should be kept within an upper portion of the absorption layer 3 or within the diffusive-concentration-distribution-adjusting layer 4 to control the impurity concentration in the multiple quantum well structure 3 strictly to be low.

In order to solve this problem, the diffusive-concentration-distribution-adjusting layer 4 is disposed between the absorption layer 3 having the type II multiple quantum well structure and the InP window layer 5. The selectively diffused p-type impurity needs to be in ohmic contact with a pixel electrode 11 in the InP window layer 5, and therefore is distributed at a high concentration. However, the concentration of Zn needs to be steeply reduced stepwise in the diffusive-concentration-distribution-adjusting layer 4. The concentration of Zn is steeply reduced stepwise so as to cross the background concentration of an opposite conductivity type (n-type) impurity in the diffusive-concentration-distribution-adjusting layer 4, or cross the background concentration of the n-type impurity in the multiple quantum well structure 3, in an upper portion of the type II multiple quantum well structure 3. The point (plane) at which the concentration of Zn crosses the background concentration of the n-type carrier constitutes the p-n junction 15. Since InGaAs used for the diffusive-concentration-distribution-adjusting layer 4 makes the Zn diffusion rate lower, as compared to InP that forms the window layer 5. Therefore, the portion in which the Zn concentration distribution is steeply reduced can be easily disposed in the InGaAs diffusive-concentration-distribution-adjusting layer 4.

When the photodiode 50 is manufactured, the epitaxial wafer is formed by depositing the above-mentioned III-V semiconductors, and thereafter, a selective diffusion mask patter 36 is disposed on the InP window layer 5 of the epitaxial wafer and Zn is selectively diffused to form the p-type regions 6, i.e., the p-n junctions 15. The pixel electrodes 11 and the ground electrode 12 are also formed when the photodiode 50 is in the epitaxial wafer state. In the stage for packaging each photodiode (chip) 50, the epitaxial wafer is diced into individual photodiodes (chips) 50. An anti-reflection (AR) layer 35 is disposed on the rear surface of the substrate to prevent reflection of light incident on the rear surface of the substrate, thereby improving quantum efficiency or sensitivity.

Figure 4:
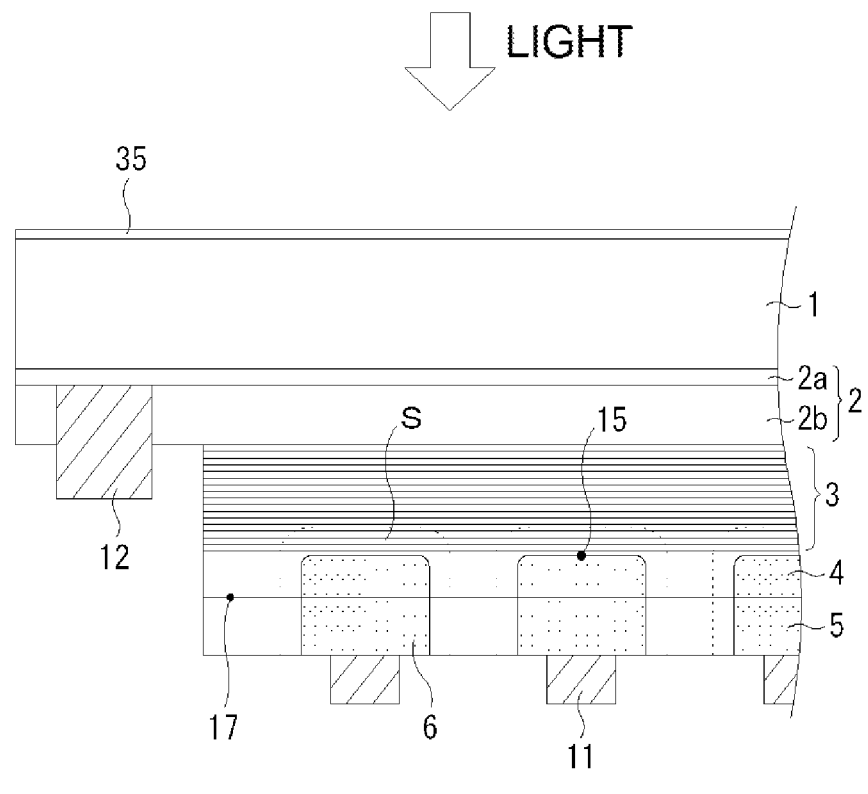
FIG. 4 is a diagram showing the photodiode waiting for light to be incident thereon.

FIG. 4 is a diagram showing the state where the photodiode 50 receives light. When a reverse bias voltage is applied to the p-n junctions 15 by the pixel electrodes 11 and the common ground electrode 12, a depletion layer S of each pixel P expands into the absorption layer 3. When light enters the depletion layer S of a certain pixel P and is absorbed therein, electron-hole pairs are generated, and the holes drift to the pixel electrode 11 while the electrodes drift to the ground electrode 12. Electric charges stored in the pixel electrodes 11 are read out at a constant time pitch, and intensity distribution of absorption signals is formed over the pixels, thereby forming an image. In this case, the reverse bias voltage with respect to the p-n junctions 15 is applied between the ground electrode 12/the InP first buffer layer 2a and the pixel electrode 11. The ground electrode 12 and the InP first buffer layer 2a need to be in ohmic contact with each other, and therefore the InP first buffer layer 2a contains the n-type impurity at a high concentration. However, the InP substrate 1 need not be conductive, and may contain an optimum impurity according to each role, or may be non-doped.

Sulfur (S), selenium (Se), tellurium (Te), silicon (Si), germanium (Ge), and tin (Sn) are n-type impurities. When the total concentration of these n-type impurities is high, expansion of the depletion layer S expanding from the p-n junction 15 toward the n-conductive side is reduced with respect to the same reverse bias voltage. The fact that the depletion layer S occupies only a small space means that the space where light absorption occurs is narrow, leading to reduction in sensitivity.

By controlling the concentrations of the impurities such as sulfur (S), selenium (Se), tellurium (Te) and the like to be low as described above, expansion of the depletion layer S toward the n-type region is increased under the same reverse bias voltage. As a result, reduction in sensitivity due to the impurities can be avoided.

Figure 5:
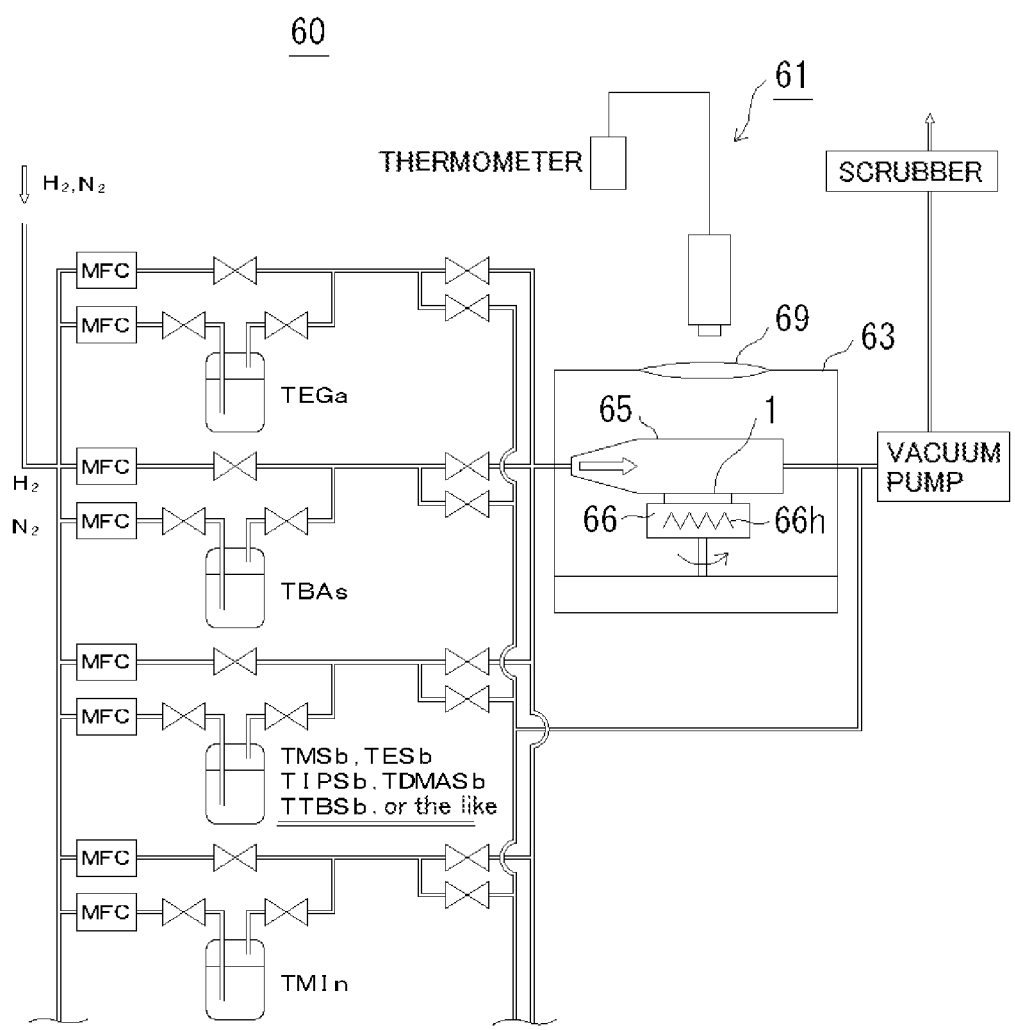
FIG. 5 is a diagram showing a growth apparatus for metal-organic vapor phase epitaxy (MOVPE).

Next, a method for manufacturing the epitaxial wafer 10 will be described. First, the features of the manufacturing method in the present embodiment will be described. The above-mentioned epitaxial wafer 10 can be manufactured by ordinary metal-organic vapor phase epitaxy (MOVPE) as shown in FIG. 5. In other words, the epitaxial wafer 10 can be manufactured by using a commercially available MOVPE growth apparatus 60. A quartz tube 65 is placed in a reaction chamber 63, and source gases are introduced into the quartz tube 65. In the quartz tube 65, a substrate table 66 is placed rotatably and hermetically. The substrate table 66 is provided with a heater 66h for heating a substrate. The temperature at the surface of an epitaxial wafer 1 during deposition is monitored by an infrared thermometer 61 through a window 69 provided at a ceiling of the reaction chamber 63. The monitored temperature is a temperature which is referred to as a growth temperature, a deposition temperature, a substrate temperature, or the like.

When the source gases commonly used for metal-organic vapor phase epitaxy, in particular, antimony source gases such as TMSb, TESb, TIPSb, TDMASb, and TTBSb which are often used, are used for growth of the type II multiple quantum well structure constituting the absorption layer 3, the multiple quantum well structure may contain impurities such as sulfur (S), selenium (Se), and tellurium (Te) at relatively high concentrations. This may result in increase in dark current and reduction in sensitivity, for the above-mentioned reasons.

Figure 6:
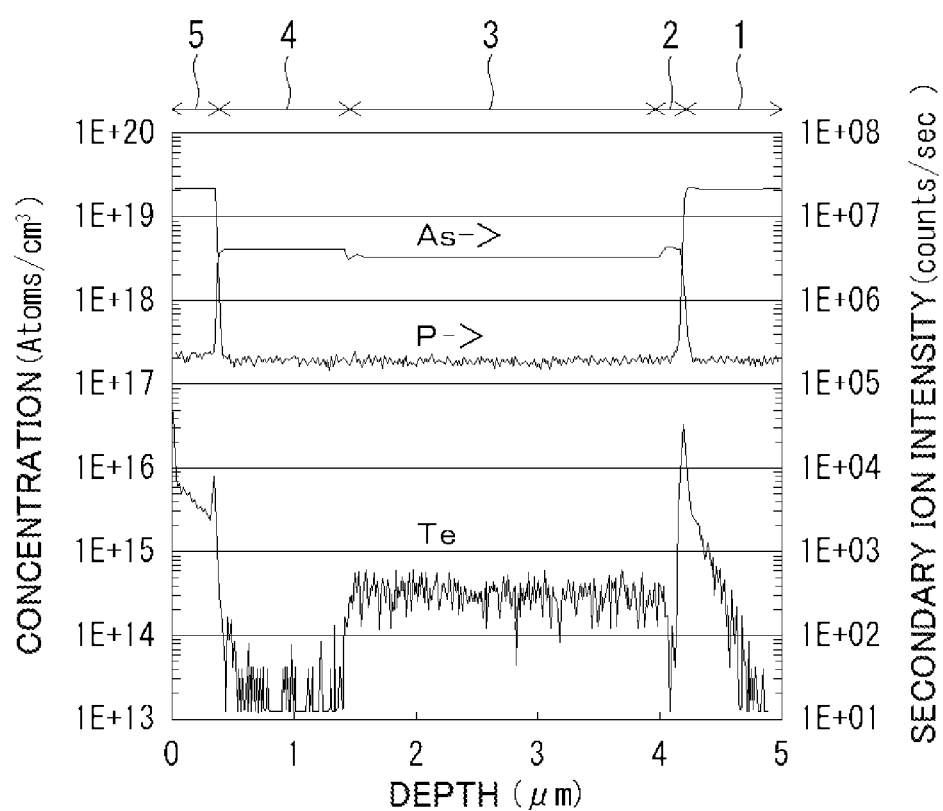
FIG. 6 is a diagram showing the result of measurement of impurity concentrations by SIMS after growth of the epitaxial wafer by MOVPE.

The inventors of the present invention have continued the study for the purpose of suppressing dark current and ensuring sensitivity, and one day, accidentally found that Te and the like are contained in the multiple quantum well (GaAsSb/InGaAs) structure 3 at relatively high concentrations. FIG. 6 shows the result of measurement of impurity concentrations by SIMS after growth of the epitaxial wafer 10 shown in FIG. 1 by MOVPE. As a source of antimony, TMSb is used. It is found that Te is contained at a high concentration (about $7 \times 10^{14}$ cm$^{-3}$) only in the multiple quantum well (GaAsSb/InGaAs) structure 3. Sb is contained only in the multiple quantum well (GaAsSb/InGaAs) structure 3, and is not contained in other portions. Therefore, it is conceivable that this Te is derived from the source of antimony. Actually, as shown in Examples later, these are cases where Te is contained at a high concentration as an impurity in the source of Sb, and it is conceivable that the above result is caused by the use of the source of antimony in the manufacture of the epitaxial wafer shown in FIG. 6. The inventors of the present invention have manufactured a photodiode excluding factors such as Te which are derived from the source of antimony, confirmed that dark current and sensitivity are improved, and arrived at the present invention. In FIG. 6, marks (rightward arrows) imparted to As and P indicate that the tick marks of these elements follow the tick marks (secondary ion intensity (counts/sec)) on the right side vertical axis of the figure. Although the concentration of Te appears to be high in the InP window layer 5 and the buffer layer 2, this is caused by that measurement of Te in the InP window layer 5 and the buffer layer 2 is affected by Si as a dopant. Actually, Te is not incorporated into the InP window layer 5 and the buffer layer 2.

A method for manufacturing the epitaxial wafer 10 according to the present embodiment will be described with reference to FIG. 5. First, an S-doped n-type InP substrate 1 is prepared in which residual stress in the surface is removed and a desired flatness is achieved by wet etching or the like. Then, the substrate 1 is set on the substrate table, and the buffer layer 2 is grown thereon. In growing the buffer layer 2, InP, as the first buffer layer 2a, is grown to a thickness in a range from 3 nm to 60 nm both inclusive, e.g., to a thickness of about 30 nm. As for source gases, TMIn (trimethylindium) or TEIn (triethylindium) is used as a source of In. As a source of P, phosphine ($PH_3$) is used. TBP (tertiarybutylphosphine) may be used. These metal-organic gas sources are unstable because of large molecular weights thereof, and are easily decomposed even at a low deposition temperature (growth temperature) of 525° C. or lower, e.g., a low temperature in a range from 450° C. to 495° C. both inclusive, whereby the InP first buffer layer 2a is epitaxially grown on the surface of the InP substrate 1.

In growing the InP first buffer layer 2a, an n-type impurity, e.g., Si, is doped at a high concentration of about $1 \times 10^{18}$ $cm^{-3}$. Preferably, tetraethylsilane (TeESi), tetramethylsilane (TeMSi), or the like is used for the doping of Si. As described above, the surface of the InP substrate 1 forms a substrate/epitaxial-layer interface, and oxygen and carbon remain thereon at high concentrations. By epitaxially growing the InP first buffer layer 2a containing Si at the high concentration on the surface of the InP substrate 1, adverse effect of attachment such as oxygen (oxide) or the like can be suppressed. The attachment degrades the crystallinity of the multiple quantum well structure, and deteriorates the flatness of the interface of each layer in the multiple quantum well structure. Although the mechanism of eliminating the adverse effect by the first buffer layer 2a containing the high concentration of dopant is not known, it is highly likely that the flattened interfaces in the multiple quantum well structure 3 are effective. Further, it is conceivable that satisfactorily epitaxial growth is realized because the material of the first buffer layer 2a is InP which is the same as the material of the InP substrate 1, as described above.

Next, the InGaAs second buffer layer 2b is grown to a thickness of 150 nm or more, e.g., to a thickness of about 300 nm. As a source of Ga (gallium), TEGa (triethylgallium) or TMGa (trimethylgallium) may be used. As a source of In, the above-mentioned TMIn or TEIn is used. As a source of As (arsenic), arsine ($AsH_3$), TBAs (tertiarybutylarsine), or TMAs (trimethylarsenic) may be used. When the second buffer layer 2b is doped with an n-type impurity, preferably, the same impurity as that for the InP first buffer layer 2a is used, and the n-type carrier concentration is set to about $3 \times 10^{17}$ $cm^{-3}$. Thus, it is possible to epitaxially grow the InGaAs second buffer layer 2b composed of the same material as one of the materials of the paired layers in the type II (GaAsSb/InGaAs) multiple quantum well structure constituting the absorption layer 3. The InGaAs second buffer layer 2b functions as a base layer because the material thereof is the same as one of the materials of the paired layers in the multiple quantum well structure, and thus realizes good crystallinity in the multiple quantum well structure.

Subsequently to the growth of the InGaAs second buffer layer 2b of the buffer layer 2, the absorption layer 3 of the type II (GaAsSb/InGaAs) multiple quantum well structure is grown. At this time, the impurity concentration of the source of antimony must be checked. As the source of antimony for growth of the multiple quantum well structure, TMSb, TESb, TIPSb, TDMASb, TTBSb, or the like is preferably used, in which the total concentration of sulfur (S), selenium (Se), tellurium (Te), silicon (Si), germanium (Ge), and tin (Sn) is less than or equal to 0.5 ppm. Thus, in the multiple quantum well structure 3, the total concentration of at least sulfur (S), selenium (Se), and tellurium (Te) can be set to be less than or equal to $5 \times 10^{15}$ $cm^{-3}$. In addition, the total concentration of sulfur (S), selenium (Se), tellurium (Te), silicon (Si), germanium (Ge), and tin (Sn) can be set to be less than or equal to $5 \times 10^{15}$ $cm^{-3}$.

Preferably, growth should be performed consistently in the same growth chamber by metal-organic vapor phase epitaxy, from the start of growth of the multiple quantum well structure 3 to the end of growth of the InGaAs diffusive-concentration-distribution-adjusting layer 4 and the InP window layer 5. As a result, a regrown interface is not included, and an interface on which oxygen and carbon remain at high concentrations is not formed. As a result, it is possible to avoid increase in dark current which is caused by the regrown interface. At this time, the growth temperature or the substrate temperature is preferably kept in a range from 400° C. to 525° C. both inclusive. If the growth temperature is higher than the temperature range, GaAsSb in the absorption layer 3 is thermally damaged to cause phase separation. If the growth temperature is lower than 400° C., the source gases for metal-organic vapor phase epitaxy are not sufficiently decomposed, and carbon is incorporated into the epitaxial layers. This carbon is derived from hydrocarbon bonded to metal in the source gases. Such incorporation of carbon into the epitaxial layers results in formation of an unintended p-type region, and resultant semiconductor devices may have poor performance. For example, resultant photodiodes may have large dark current and cannot be practically used as products.

After the epitaxial wafer 10 has been manufactured, Zn is introduced into the epitaxial wafer 10 by selective diffusion as described above, whereby pixels P are formed so as to be separated from adjacent pixels P by regions that have not been subjected to the selective diffusion. Thereafter, p-electrodes serving as the pixel electrodes 11 and an n-electrode serving as the ground electrode 12 common to the respective pixels are formed. In forming the ground electrode 12, the multiple quantum well structure 3 is partially removed by etching at a predetermined peripheral portion of the epitaxial wafer 10 to expose the buffer layer 2. Thereafter, a resist mask pattern having an opening corresponding to a planar position of the ground electrode 12 is formed, and the InGaAs second buffer layer 2b is etched and removed with an etchant having a composition of phosphoric acid (85%): hydrogen peroxide solution (30%):water=1:1:4. That is, InGaAs is etched and InP is caused to function as an etch stop layer. In this way, when the first buffer layer 2a/the second buffer layer 2b is InP/InGaAs, the etchant having the composition of phosphoric acid (85%):hydrogen peroxide solution (30%):water=1:1:4 is used. Thereby, the surface of the InP first buffer layer can be reliably exposed, and the n-electrode can be easily brought into ohmic contact with the InP first buffer layer. AuGeNi or the like may be used for the n-electrode 12, and AuZn or the like may be used for the p-side pixel electrodes.

Example

An example performed to verify the effect of the present invention will be described. Five types of TMSb, as a source of antimony, having different impurity concentrations were prepared for growth of GaAsSb of a (GaAsSb/InGaAs) multiple quantum well structure. Table 1 shows the concentrations of various impurities contained in TMSb used for manufacture of Sample A3 and Sample A5 described later. The impurity concentrations are measured by ICP emission spectral analysis (ICP-OES). In Sample A5, the source of antimony having the lowest impurity concentration was used, and each impurity has a concentration lower than the detection limit. On the other hand, Te clearly remains in the source of antimony of Sample A3, and may be incorporated into the multiple quantum well structure to adversely affect the multiple quantum well structure.

TABLE 1

|    | Concentration of impurity contained in Sb source of Sample A3 (ppm) | Concentration of impurity contained in Sb source of Sample A5 (ppm) |
|----|----|----|
| Si | <0.01 | <0.01 |
| Ge | <0.01 | <0.01 |
| Sn | <0.01 | <0.01 |
| Pb | <0.01 | <0.01 |
| S  | <0.01 | <0.01 |
| Se | <0.01 | <0.01 |
| Te | 0.2   | <0.01 |

In this example, five pieces of the epitaxial wafer 10 shown in FIG. 1 were manufactured, and the photodiode shown in FIG. 3 was formed by using each of these epitaxial wafers. In growing the type II (GaAsSb/InGaAs) multiple quantum well structure 3 in each epitaxial wafer 10, the above-mentioned five types of TMSb as the source of antimony having different impurity concentrations were used to manufacture five photodiodes including multiple quantum well structures having different impurity concentrations. These photodiodes are Samples A1 to A5. In manufacturing the samples, the total concentration of sulfur (S), selenium (Se), and tellurium (Te) in TMSb as the source of antimony is in a range from less than 0.01 (ppm) to 0.7 (ppm).

The total concentration ($cm^{-3}$) of sulfur (S), selenium (Se), and tellurium (Te) in the multiple quantum well structure of each sample is in a range from $2 \times 10^{14}$ $cm^{-3}$ (2E14 $cm^{-3}$) to $2 \times 10^{16}$ $cm^{-3}$ (2E16 $cm^{-3}$). In the case of Sample A3, most of the total concentration of S, Se, and Te is the concentration of Te. When the total concentration of S, Se, and Te in TMSb as the source of antimony was less than or equal to 0.5 ppm, the total concentration of S, Se, and Te in the multiple quantum well structure was less than or equal to $5 \times 10^{15}$ $cm^{-3}$ (5E15 $cm^{-3}$).

These five samples were evaluated for dark current and sensitivity (wavelength of 2 μm) to verify the effect of the present invention. The result is shown in Table 2.

TABLE 2

|  | Sample A1 | Sample A2 | Sample A3 | Sample A4 | Sample A5 |
|---|---|---|---|---|---|
| Concentration of S, Se, Te in Sb source (ppm) | 0.7 | 0.35 | 0.2 | 0.08 | <0.01 |
| Concentration of S, Se, Te in quantum well structure ($cm^{-3}$) | 2E+16 | 5E+15 | 2.5E+15 | 5E+14 | 2E+14 |
| Evaluation of dark current | C | B | A | A | A |
| Evaluation of sensitivity | C | B | B | A | AA |

C: Not permissible
B: Permissible
A: Good
AA: Very good

In Sample A1 which is a comparative example of the present invention, the total concentration of S, Se, and Te in the multiple quantum well structure was very high, i.e., $2 \times 10^{16}$ $cm^{-3}$ (2E16 $cm^{-3}$). Therefore, both the dark current and the sensitivity did not reach the practical level, and were evaluated to be "not permissible". On the other hand, in Sample A2, the above-mentioned concentration in the multiple quantum well structure was at the permissible upper limit, i.e., $5 \times 10^{15}$ $cm^{-3}$ (5E15 $cm^{-3}$). In this case, both the dark current and the sensitivity reached the practical level, and were evaluated to be "permissible". In contrast to the above samples, in Samples A3 to A5 in which the total concentration of S, Se, and Te in the multiple quantum well structure is less than or equal to $2.5 \times 10^{15}$ $cm^{-3}$ (2.5E15 $cm^{-3}$), the dark current was low and improved by one rank. In addition, the sensitivity was evaluated to be "good" when the impurity concentration was as low as that of Sample A4. In the case of Sample A5, reflecting the very low impurity concentration shown in Table 1, the total of the impurity concentrations in the multiple quantum well structure was about one-order lower than that of Sample A3. Reflecting this, the dark current was evaluated to be "good". In particular, the sensitivity was evaluated to be "very good".

INDUSTRIAL APPLICABILITY

According to the present invention, when a type II (GaAsSb/InGaAs) multiple quantum well structure constituting an absorption layer is grown by MOVPE, the concentrations of impurities such as Te in a source gas of antimony are reduced, thereby providing an epitaxial wafer which allows manufacture of a photodiode having suppressed dark current and good sensitivity. This contributes to high-definition analysis and image-pickup particularly in the near-infrared to infrared region.

DESCRIPTION OF THE REFERENCE CHARACTERS

1 InP substrate
2 buffer layer
2a first buffer layer
2b second buffer layer
3 absorption layer of type II multiple quantum well structure
3a first layer (GaAsSb)
3b second layer (InGaAs)
4 InGaAs diffusive-concentration-distribution-adjusting layer
5 InP window layer
6 p-type region
10 epitaxial wafer
11 p-electrode (pixel electrode)
12 ground electrode (n-electrode)
15 p-n junction 17 interface between diffusive-concentration-distribution-adjusting layer and window layer
35 AR (Anti-Reflection) layer
36 selective diffusion mask pattern
50 photodiode (photodiode array)
60 growth apparatus
61 infrared thermometer
63 reaction chamber
65 quartz tube
66 substrate table
66h heater
69 window of reaction chamber
P pixel
S depletion layer

The invention claimed is:

1. An epitaxial wafer comprising:
a III-V semiconductor substrate; and
a multiple quantum well structure disposed on the substrate, and including a plurality of pairs of a first layer and a second layer, wherein sulfur, selenium, and tellurium are contained as impurities,
wherein a total concentration of elements contained as impurities in the multiple quantum well structure is less than or equal to $5\times10^{15}$ cm$^{-3}$, and
wherein the multiple quantum well structure contains antimony as a constituent element thereof.

2. The epitaxial wafer according to claim 1, wherein silicon, germanium, and tin are further contained as impurities, and a total concentration of sulfur, selenium, tellurium, silicon, germanium, and tin contained as impurities is less than or equal to $5\times10^{15}$ cm$^{-3}$.

3. The epitaxial wafer according to claim 1, wherein
the substrate comprises InP, and
in the multiple quantum well structure, the first layer comprises a semiconductor that contains at least Ga, As, and Sb, and the second layer comprises a semiconductor that contains at least In, Ga, and As.

4. The epitaxial wafer according to claim 1, further comprising:
a first conductivity type III-V semiconductor layer disposed on a side, facing the substrate, of the multiple quantum well structure; and
a second conductivity type III-V semiconductor layer disposed on the multiple quantum well structure.

5. A photodiode manufactured by using the epitaxial wafer according to claim 1.

6. The epitaxial wafer according to claim 1, wherein the antimony is contained as a constituent element in only the first layer, and an aggregate concentration of sulfur, selenium, tellurium, silicon, germanium, and tin contained as impurities in the first layer is less than or equal to $1\times10^{16}$ cm$^{-3}$.

7. The epitaxial wafer according to claim 6, wherein the total concentration of sulfur, selenium, tellurium, silicon, germanium, and tin contained as impurities in the second layer is less than or equal to $1\times10^{15}$ cm$^{-3}$.

8. The epitaxial wafer according to claim 1, further comprising:
a diffusive-concentration-distribution-adjusting layer disposed on the multiple quantum well structure, and comprising a III-V semiconductor; and
a window layer disposed on the diffusive-concentration-distribution-adjusting layer, and comprising a III-V semiconductor.

9. The epitaxial wafer according to claim 8, wherein the window layer comprises InP, and a regrown interface on which at least one of oxygen, carbon, and hydrogen is accumulated is absent at a boundary portion between the InP window layer and a layer beneath the InP window layer.

10. A method for manufacturing an epitaxial wafer on a III-V semiconductor substrate, comprising the steps of;
growing a III-V semiconductor buffer layer on the substrate; and
growing a multiple quantum well structure comprising a III-V semiconductor on the buffer layer, wherein sulfur, selenium, and tellurium are contained as impurities, and wherein the multiple quantum well structure contains antimony as a constituent element thereof,
wherein in the step of growing the multiple quantum well structure, the multiple quantum well structure is grown by metal-organic vapor phase epitaxy so that a total concentration of elements contained as impurities in the multiple quantum well structure is less than or equal to $5\times10^{15}$ cm$^{-3}$.

11. The method for manufacturing the epitaxial wafer according to claim 10, wherein, in the step of growing the multiple quantum well structure, a metal-organic source in which a total concentration of sulfur, selenium, tellurium, silicon, germanium, and tin is less than or equal to 0.5 ppm is used as a source of antimony used for the metal-organic vapor phase epitaxy.

* * * * *